United States Patent [19]
Park et al.

[11] Patent Number: 5,614,950
[45] Date of Patent: Mar. 25, 1997

[54] CCD IMAGE SENSOR AND METHOD OF PREVENTING A SMEAR PHENOMENON IN THE SENSOR

[75] Inventors: Chul H. Park, Chungcheongbuk-do; Kwang B. Song, Seoul, both of Rep. of Korea

[73] Assignee: LG Semicon Co., Ltd., Chungcheongbuk-do, Rep. of Korea

[21] Appl. No.: 510,232

[22] Filed: Aug. 2, 1995

[51] Int. Cl.$^6$ .................................................. H04N 5/335
[52] U.S. Cl. ........................ 348/315; 348/249; 348/340; 257/232; 257/233; 257/432
[58] Field of Search ..................... 257/232, 233, 257/432, 435; 348/311, 315, 316, 317, 319, 320, 321, 322, 323, 324, 241, 248, 249, 250, 340; H04N 9/64

[56] References Cited

U.S. PATENT DOCUMENTS

| | | | |
|---|---|---|---|
| 4,291,239 | 9/1981 | Weimer | 307/221 D |
| 4,453,177 | 6/1984 | Berger et al. | 358/44 |
| 4,455,575 | 6/1984 | Murakoshi | 358/213 |
| 4,500,915 | 2/1985 | Koike et al. | 358/44 |
| 4,774,586 | 9/1988 | Koike et al. | 358/213.29 |
| 5,274,476 | 12/1993 | Lee | 358/483 |
| 5,280,186 | 1/1994 | Lee | 257/232 |
| 5,306,926 | 4/1994 | Yonemoto | 257/432 |
| 5,371,397 | 12/1994 | Maegawa | 257/432 |
| 5,418,387 | 5/1995 | Nakamura et al. | 257/231 |
| 5,493,143 | 2/1996 | Hokari | 257/432 |

*Primary Examiner*—Wendy Garber
*Assistant Examiner*—Ngoc-Yen Vu

[57] ABSTRACT

A charge coupled device image sensor which can prevent smear and improve sensitivity, including a substrate of a first conductive type, a first well of a second conductive type formed on one side of said substrate, a second well of the second conductive type formed on the other side of said substrate, a pair of photo-detecting areas formed adjoining in said first well, a pair of charge transfer areas formed close to each photo-detecting area and adjoining in said second well, a channel stop area formed between said adjoining photo-detecting areas and said charge transfer areas and for isolating each of the areas, respectively, high-density impurities areas of the second conductive type being formed on the upper surface of said photo-detecting area, a gate insulation film formed on the whole substrate, a pair of transfer gates formed on said gate insulation film at the upper side of each charge transfer area, a insulation film for encompassing said transfer gate and being formed on said gate insulation film except said pair of photo-detecting areas, a light-shading film formed on said insulation film except said pair of photo-detecting areas, a leveling substrate formed on the whole substrate, and, a micro lens formed said leveling substrate at the upper side of said pair of photo-detecting areas.

16 Claims, 2 Drawing Sheets

CCD IMAGE SENSOR AND METHOD OF PREVENTING A SMEAR PHENOMENON IN THE SENSOR

BACKGROUND OF THE INVENTION

The present invention relates to a charge coupled device (CCD) image sensor, and more particularly to a charge coupled device image sensor which can prevent smear and improve sensitivity.

Referring to FIG. 1A, first and second p$^-$-type wells 12 and 13 are formed on a n-type substrate 11. An n$^+$-type photo diode 14 and an n$^+$-type VCCD (vertical charge coupled device) 17 which is a charge transfer area are formed in first and second p$^-$-type wells 12 and 13, respectively. On the upper surface of n$^+$-type photo diode 14, a p$^{++}$-type surface isolation substrate 15 is formed and a third p$^-$-type well 16 encompassing n$^+$-type VCCD 17 is formed.

A gate insulation film 19 is formed on the whole surface of the substrate. A transfer gate 20, an in-between insulation film 21 and a light-shading film 22 are sequentially formed on gate insulation film 19, except on photo diode 14. A passivation layer 23 is formed on gate insulation film 19 and the sequentially deposited gate and films.

A leveling substrate 24 is formed on passivation layer 23 and a micro lens 25 is formed on leveling substrate 24 which is on the upper side of photo diode 14.

A reference numeral 18 is a channel stop area for isolating pixels.

In a conventional charge coupled device image sensor having the above configuration, incident light through a camera lens is concentrated by micro lens 25 to be input to photo diode 14. The incident light to photo diode 14 is photoelectrically converted into charges. The photoelectrically converted charges are vertically transferred to HCCD (horizontal charge coupled device, not shown) through VCCD 17 according to a VCCD clock signal. The charges transferred to the HCCD are horizontally transferred by a HCCD clock signal. After being detected as voltage by floating diffusion at the tip of the device, the charges are amplified by an amplifier and transferred to a peripheral circuit.

In a conventional charge coupled device image sensor, light-shading film 22 is formed to shade light on the substrate, except on the photo diode 14 so that the light concentrated through micro lens 25 is input only onto the photo diode 14. As shown in FIG. 1A, light-shading film 22 is formed on both edge parts of photo diode 14. Accordingly, the light input to the edge parts of the photo diode is cut off and are not input to the photo diode by the light-shading film. So, it becomes a problem that the light-sensitivity of the photo diode decreases due to the reduced light-receiving area of the photo diode.

As shown in FIG. 1B, the concentrated light through the center portion of the micro lens 25 is input to the photo diode 14 to generate signal charges. However, it is a problem that the light input through the both edge parts of the micro lens is not input to the photo diode 14 but to VCCD 17 so as to cause smear phenomenon. In addition, one micro lens is arranged to correspond with one photo diode in fabricating the above charge coupled device image sensor. However, as a pattern size becomes smaller according to high integration, it is difficult to form the micro lens precisely corresponding to each photo diode.

SUMMARY OF THE INVENTION

To solve the above problems, it is an object of the present invention to provide a charge coupled device image sensor which can increase the light-receiving area of a photo diode by arranging one micro lens to the adjoining two photo diodes.

It is another object of the present invention to provide a charge coupled device image sensor which can prevent smear phenomenon by concentrating the light being concentrated through a micro lens onto only a photo diode.

Accordingly, to achieve the above objects, there is provided a charge coupled device image sensor comprising: a substrate of a first conductive type; a first well of a second conductive type formed on one side of the substrate; a second well of the second conductive type formed on the other side of the substrate; a pair of photo-detecting areas formed adjoining in the first well; a pair of charge transfer areas formed close to each photo-detecting area and adjoining in the second well; a channel stop area formed between the adjoining photo-detecting areas and the charge transfer areas and for isolating each of the areas, respectively; high-density impurities areas of the second conductive type being formed on the upper surface of the photo-detecting area; a gate insulation film formed on the whole substrate; a pair of transfer gates formed on the gate insulation film at the upper side of each charge transfer area; a insulation film for encompassing the transfer gate and being formed on the gate insulation film except the pair of photo-detecting areas; a light-shading film formed on the insulation film except the pair of photo-detecting areas; a leveling substrate formed on the whole substrate; and a micro lens formed the leveling substrate at the upper side of the pair of photo-detecting areas.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE PREFERRED EMBODIMENTS

Figure 1A:
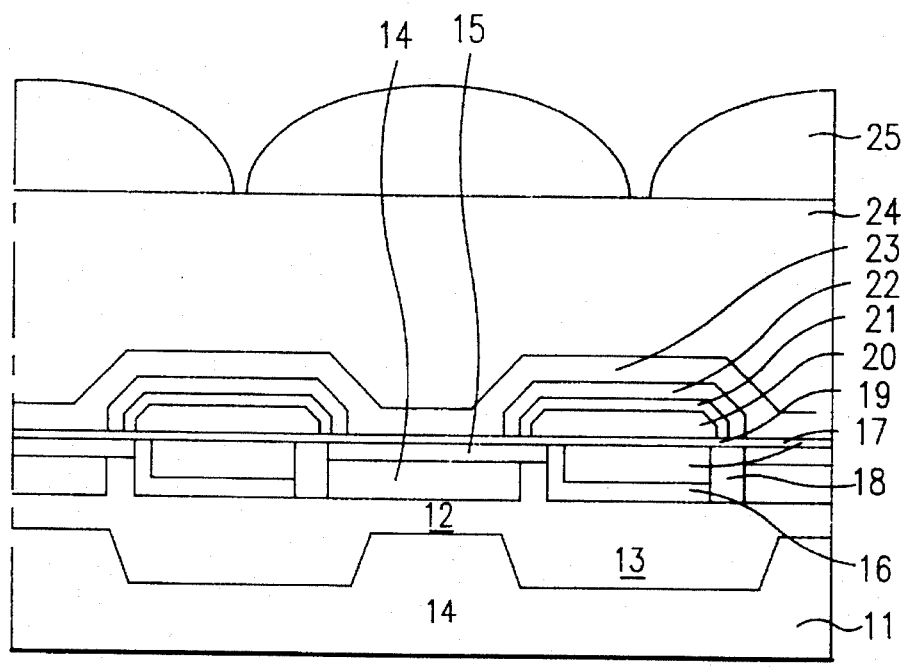
FIGS. 1A and 1B are cross sectional views illustrating the conventional charge coupled device image sensor.
Figure 1B:
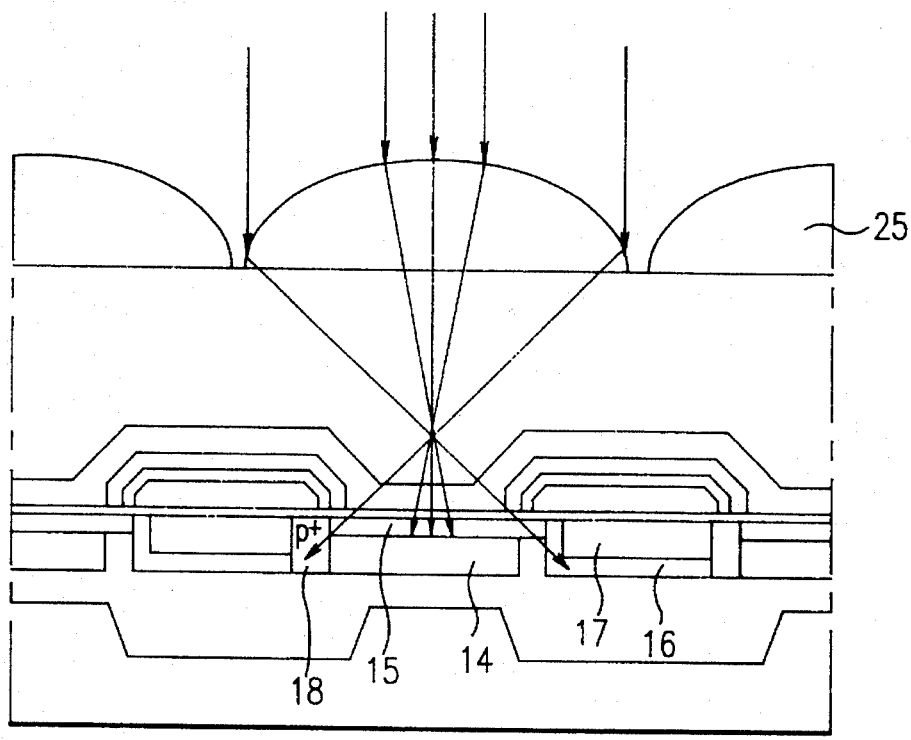
Figure 2A:
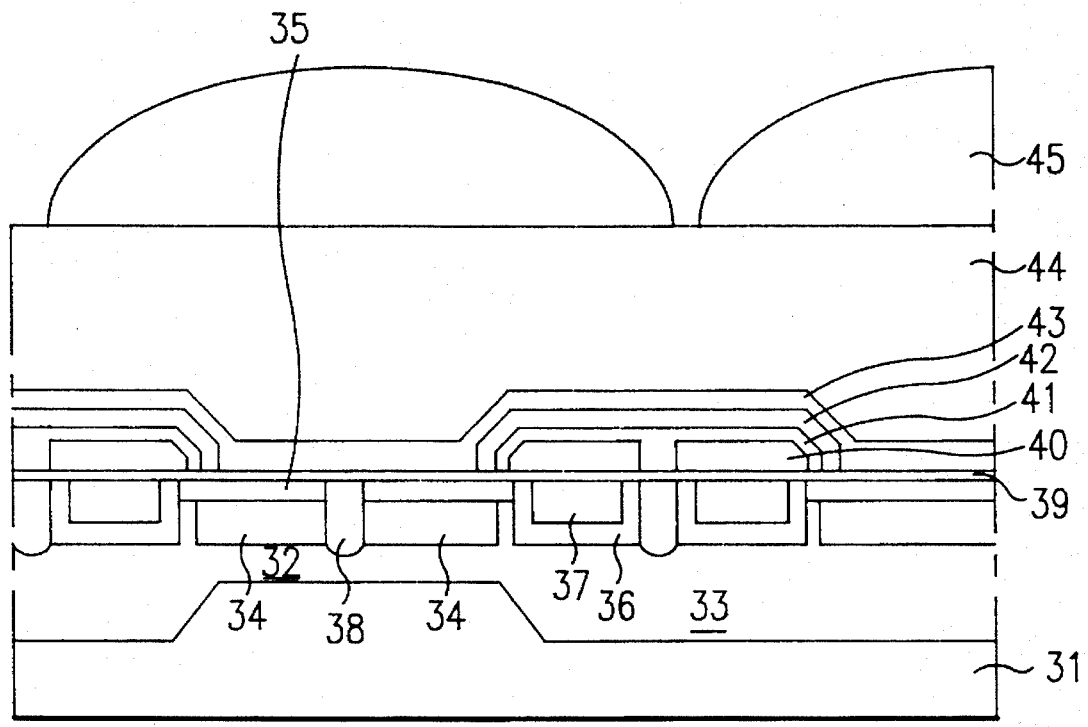
FIGS. 2A and 2B are cross sectional views illustrating the charge coupled device image sensor according to the embodiments of the present invention.
Figure 2B:
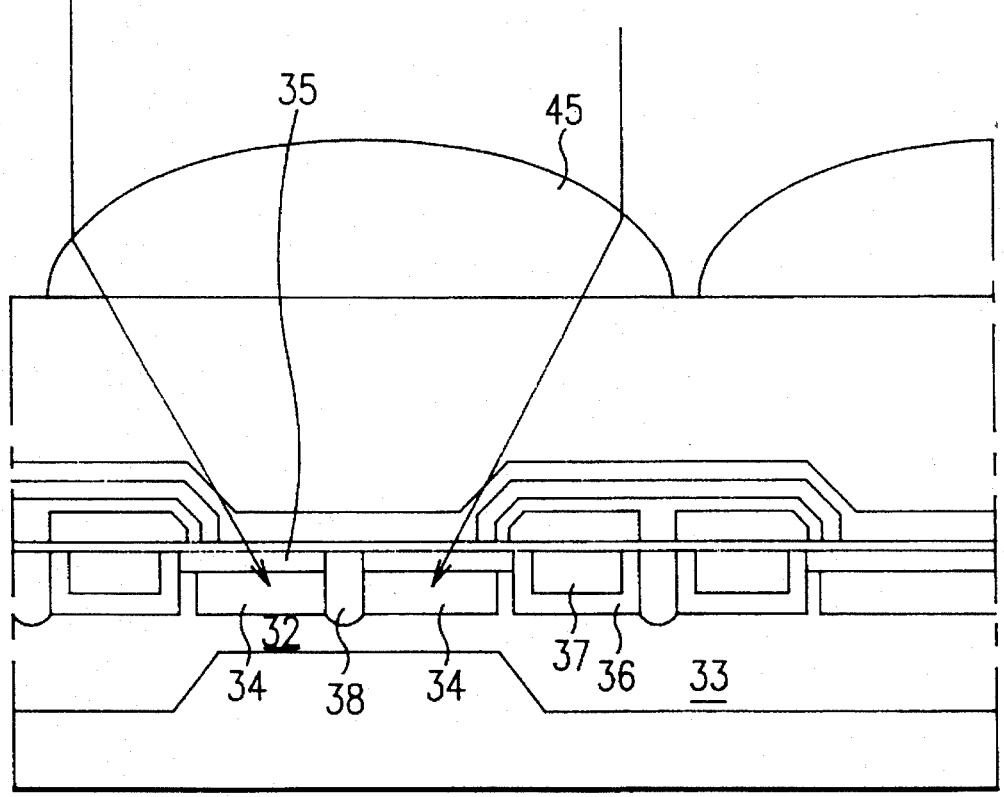

FIGS. 2A and 2B show the cross sectional views of the charge coupled device (CCD) image sensor according to the embodiments of the present invention. Referring to FIG. 2A, in the charge coupled device image sensor of the present invention, first and second p-type wells 32 and 33 are formed on an n-type substrate 31. In first p-type well 32, two n$^+$-type photo diodes 34 are arranged on in parallel at the both sides of channel stop area 38. On the photo diodes 34, a p$^{++}$-type surface isolation substrate 35 is formed. In second p-type well 33, two n$^+$-type VCCDs 37 (a charge transfer area) are arranged in parallel at the both sides of channel stop area 38. A third p-type well 36 is formed around two n⁺-type VCCDs 37.

A transfer gate 40, in-between insulation film 41 and a light-shading film 42 of metal are sequentially formed on a gate insulating film 39, except on two adjoining photo diodes 34. A passivation layer 43 of nitride film is formed on the whole substrate with leveling substrate 44 being formed thereon. A micro lens 45 is formed on leveling substrate 44 to have at least one micro lens 45 arranged to correspond two adjoining photo diodes 34.

In the conventional art, the photo diode and the VCCD are sequentially and alternatively arranged, and the channel stop areas are formed between them so as to isolate pixels. In the present invention, however, at least two the photo diodes and a VCCD are sequentially and alternatively arranged, and the channel stop areas are formed between the adjoining photo diodes and between the adjoining VCCDs, respectively, so as to isolate pixels.

In the configuration of the present invention, since two photo diodes 34 are arranged in parallel at the both sides of channel stop area 38 and one micro lens 45 is arranged in front of the two photo diodes 34, the light-shading film 42 is formed only at one edge of each photo diode 34 as shown in FIG. 2A, so that the light-receiving area of the photo diode increases.

Accordingly, as shown in FIG. 2B, since the light focused through one micro lens 45 is input to two photo diodes 34, the light input through the both edges of the micro lens 45 is input to the two photo 34 diodes arranged in parallel.

As described above, the charge coupled device image sensor of the present invention has the configuration that two adjoining photo diodes are arranged in parallel and one micro lens is arranged to correspond with two photo diodes and that a light-shading film is formed at one side of each of the photo diodes. Therefore, light sensitivity can be improved by increasing the light-receiving area of the photo diodes. Also, light received through the edge part of the micro lens is totally input to the photo diode so that the smear phenomenon can be fully removed by preventing the light input to the VCCD.

In addition, since the light input to a plurality of photo diodes is focused through a single micro lens, at least two photo diodes are used per one micro lens. Thus, a micro lens with a less radius curvature can be used and the fabricating process of the micro lens in a high integrated device becomes easier since a single micro lens is needed for the plurality of photo diodes.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A charge coupled device image sensor comprising:

a substrate of a first conductive type;

a first well of a second conductive type formed on one side of said substrate;

a second well of the second conductive type formed on the other side of said substrate;

a pair of photo-detecting areas formed adjoining in said first well;

a pair of charge transfer areas formed close to each photo-detecting area and adjoining in said second well;

a plurality of channel stop areas each formed between said adjoining photo-detecting areas and between said charge transfer areas, for isolating each of the areas;

high-density impurities areas of the second conductive type being formed on the upper surface of said photo-detecting areas;

a gate insulation film formed on the substrate;

a pair of transfer gates formed on said gate insulation film at the upper side of each charge transfer area;

an insulation film for encompassing said transfer gates and being formed on said gate insulation film except said pair of photo-detecting areas;

a light-shading film formed on said insulation film except said pair of photo-detecting areas;

a leveling substrate formed on the substrate; and a microlens formed on said leveling substrate and covering said pair of photo-detecting areas, one of said pair of charge areas, and one of another pair of charge transfer areas formed adjacent said pair of photo-detecting areas.

2. A charge coupled device image sensor of claim 1, wherein said pair of charge transfer areas include a plurality of vertical CCDs.

3. An image sensing device comprising:

pairs of photo-detecting areas formed in a well on a substrate, each pair including first and second photo-detectors;

a plurality of first stop areas each formed between the first and second photodetectors;

pairs of charge transfer areas, each pair formed between the pairs of photo-detecting areas and including first and second charge transfer areas;

a plurality of second stop areas each formed between the first and second charge transfer areas; and a plurality of microlenses, each microlens formed over the first charge transfer area of one pair of charge transfer areas, the second charge transfer area of another pair of charge transfer areas, and one of the pairs of photo-detecting areas.

4. An image sensing device of claim 3, further comprising:

high-density impurities areas formed on the pairs of photo-detecting areas; and a gate insulation film formed on the high-density impurities areas and the pairs of charge transfer areas.

5. An image sensing device of claim 4, further comprising:

pairs of transfer gates, each pair formed on the gate insulation film over one of the pairs of charge transfer areas;

an insulation film formed on the pairs of transfer gates;

a light-shading film formed on the insulation film; and a passivation layer formed on the light-shading film and portions of the gate insulation film.

6. An image sensing device of claim 5, further comprising:

a leveling substrate formed on the passivation layer so as to provide a flat surface on which the plurality of microlenses are formed.

7. An image sensing device of claim 3, wherein each of the first and second charge transfer areas includes a vertical CCD.

8. An image sensing device of claim 3, wherein each of the first and second photodetectors includes a photodiode.

9. An image sensing device of claim 3, wherein each microlens concentrates light onto said one of the pairs of photo-detecting areas so as to prevent a smear phenomenon.

10. A method of preventing a smear phenomenon in an image sensing device, the method comprising the steps of:

forming pairs of photo-detecting areas in a well on a substrate, each of the pairs of photo-detecting areas including first and second photodetectors;

providing a plurality of first stop areas each formed between the first and second photodetectors;

providing pairs of charge transfer areas, each pair formed between the pairs of photo-detecting areas and including first and second charge transfer areas;

providing a plurality of second stop areas each formed between the first and second charge transfer areas; and providing a plurality of microlenses each formed over the first charge transfer area of one pair of charge transfer areas, the second charge transfer area of another pair of charge transfer areas, and one of the pairs of photo-detecting areas.

11. A method of claim 10, further comprising the steps of:

forming high-density impurities areas on the pairs of photo-detecting areas; and forming a gate insulation film on the high-density impurities areas and the pairs of charge transfer areas.

12. A method of claim 11, further comprising the steps of:

providing pairs of transfer gates, each pair formed on the gate insulation film over one of the pairs of charge transfer areas;

forming an insulation film on the pairs of transfer gates;

forming a light-shading film on the insulation film; and forming a passivation layer on the light-shading film and portions of the gate insulation film.

13. A method of claim 12, further comprising the step of:

forming a leveling substrate on the passivation layer so as to provide a flat surface on which the plurality of microlenses are formed.

14. A method of claim 10, wherein each of the first and second charge transfer areas includes a vertical CCD.

15. A method of claim 10, wherein each of the first and second photodetectors includes a photodiode.

16. A method of claim 10, wherein each microlens concentrates light onto said one of the pairs of photo-detecting areas so as to prevent a smear phenomenon.

* * * * *